United States Patent [19]

Nakai et al.

[11] Patent Number: 4,942,419
[45] Date of Patent: Jul. 17, 1990

[54] IMAGE RECORDING APPARATUS

[75] Inventors: Hitoshi Nakai; Toshio Sakai, both of Nagoya, Japan

[73] Assignee: Brother Kogyo Kabushiki Kaisha, Aichi, Japan

[21] Appl. No.: 270,650

[22] Filed: Nov. 14, 1988

[30] Foreign Application Priority Data

Nov. 12, 1987 [JP] Japan .................. 62-287751
Jan. 12, 1988 [JP] Japan .................. 63-2310[U]

[51] Int. Cl.$^5$ .................................. G03B 27/32
[52] U.S. Cl. .............................. 355/27; 355/32
[58] Field of Search ............ 355/27, 32, 99, 100, 355/106; 361/212, 214, 220, 221, 234

[56] References Cited

U.S. PATENT DOCUMENTS

| | | | |
|---|---|---|---|
| 3,087,403 | 4/1963 | Herrick, Jr. | 355/100 |
| 4,336,565 | 6/1982 | Murray et al. | 361/221 X |
| 4,363,070 | 12/1982 | Kisler | 361/221 X |
| 4,402,593 | 9/1983 | Bernard et al. | 361/221 X |
| 4,810,614 | 3/1989 | Sangyoji et al. | 430/138 |

Primary Examiner—Brian W. Brown
Attorney, Agent, or Firm—Oliff & Berridge

[57] ABSTRACT

In an image recording apparatus for forming an image on a photosensitive recording medium by exposing the matter to light through a light-transmissive original or a mask member, a light-transmissive and dielectric conveying means is disposed between a light source and the photosensitive recording medium and has an outer surface for carrying thereon the original or a mask member with a space between the latter and the photosensitive recording medium. The conveying means is electrified by electrifying means such as a corotron, a brush to electrostatically attract the original or a mask member thereto.

10 Claims, 3 Drawing Sheets

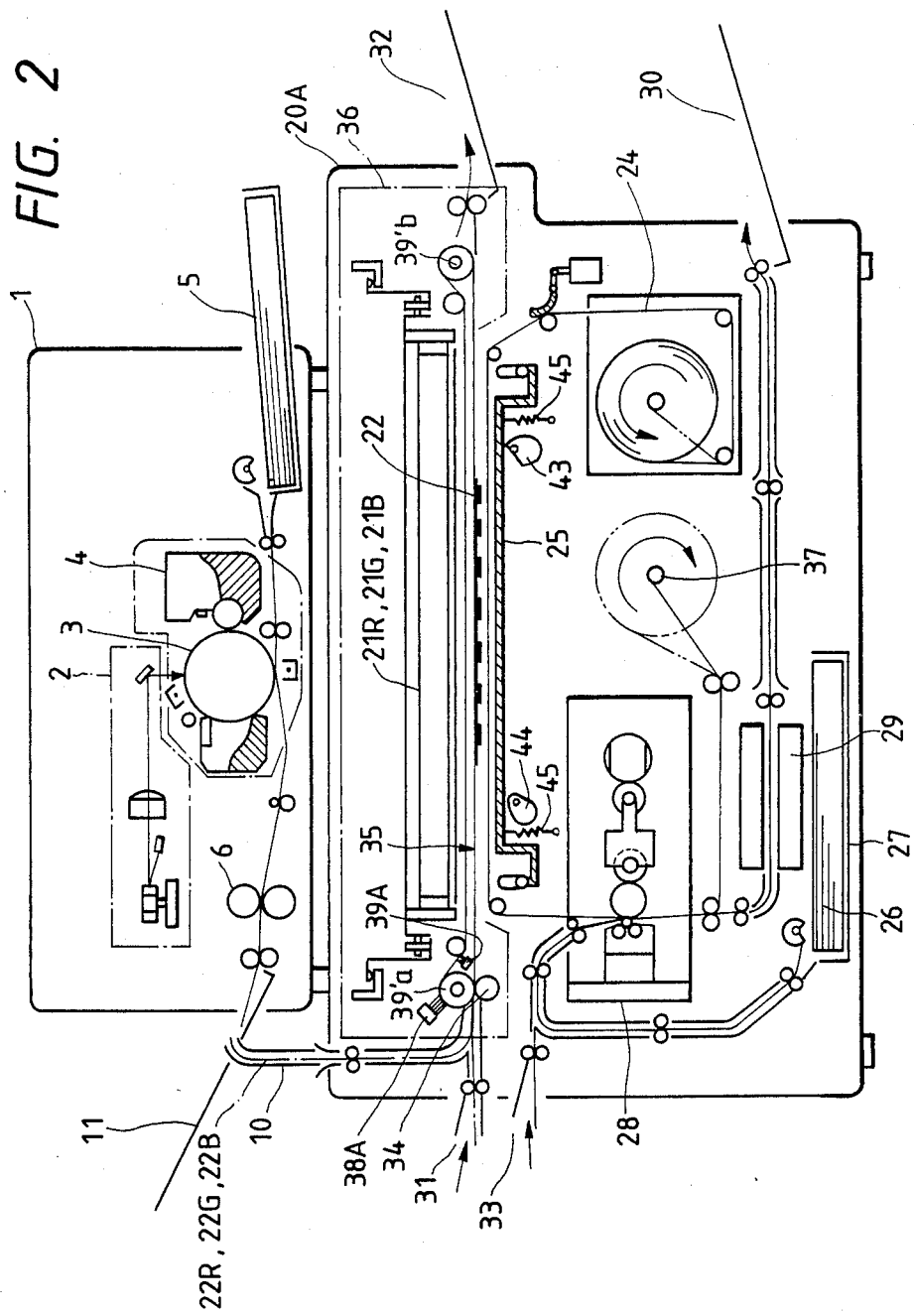

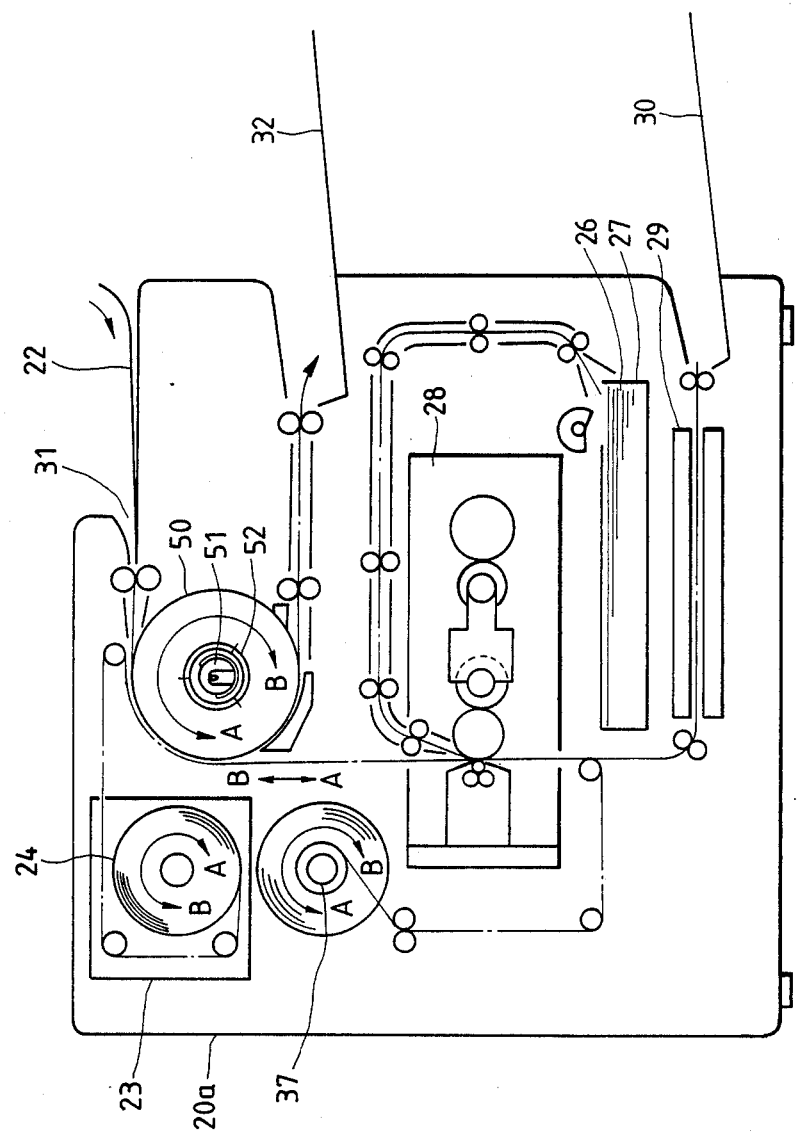

IMAGE RECORDING APPARATUS

BACKGROUND OF THE INVENTION

The present invention relates to an image recording apparatus, and more particularly to an apparatus for recording an image on a photosensitive recording medium by exposing the latter to light through a light-transmissive original or a mask member.

Conventionally, various image recording apparatus of the type described above are known, being divided chiefly into two groups. In the apparatus of one group, a photosensitive recording medium is exposed to light directly through a light-transmissive original. In the apparatus of the other group, a photosensitive recording medium is exposed to light through a mask member which is produced according to image information on a light-transmissive original.

FIG. 3 of the accompanying drawings illustrates a typical conventional color image recording apparatus of the type using the mask member. This apparatus comprises a light-transmissive drum 50 for exposure, a pressure developing device 28, and a heat-fixing device 29. A photosensitive recording medium 24 is drawn from a roll contained in a paper cassette 23, extends round the light-transmissive drum 50, is then fed to the pressure developing device 28, and is finally wound round a take-up reel 37. In the meantime, a mask member 22 is inserted in the apparatus from an insertion port 31 disposed at one side of a housing 20a, is then fed as sandwiched between the light-transmissive drum 50 and the photosensitive recording medium 24, and is finally separated from the photosensitive recording medium 24 and discharged onto a discharge tray 32.

With the mask member 22 thus sandwiched between the light-transmissive drum 50 and the photosensitive recording medium 24, a lamp (light source) 51 built in the light-transmissive drum 50 is lighted to expose the photosensitive recording medium 24 through achromatic resolution filter 52. In the conventional apparatus, the photosensitive recording medium 24 is a color photosensitive sheet coated with photosensitive microcapsules, such as disclosed in U.S. Pat. No. 4,399,209. Accordingly, more than one mask member 22 (to obtain a full-color image, three mask members for red, green and blue) is used. Such plurality of mask members 22 are fed one after another to the light-transmissive drum 50 from the insertion port 31, during which time the photosensitive recording medium 24 is repeatedly moved back and forth in the directions of arrows A, B as the light-transmissive drum 50 rotates in opposite directions. Then the photosensitive recording medium 24 is fed to the pressure developing device 28 where a developer sheet 26 is paid out from a stack contained in a sheet cassette 27 and is laid over the photosensitive recording paper 24. The developer sheet 26 is coated with a developer material, while the photosensitive recording medium 24 is coated on one surface with a layer comprising microcapsules encapsulating dye precursors as a main component. When the microcapsules on the photosensitive recording medium 24 are ruptured as the latter together with the developer sheet 26 is pressed by the pressure developing device 28, the developer material on the developer sheet 26 reacts to the dye precursors on the photosensitive recording medium 24 to develop a visible color image on the surface of the developer sheet 26. Subsequently, in the heat-fixing device, the developer paper 2G is expedited to take on color and is treated to become glassy, whereupon the developer paper 26 is discharged onto another discharge tray 30.

With this arrangement, since the mask member 22 (or the light-transmissive original) and the photosensitive recording medium 24 are brought in tight contact with each other with precision, a picture image with clear contour can be obtained.

However, with this conventional apparatus, it is difficult to perfectly synchronize the feeding of the photosensitive recording paper 24 with the rate of rotation of the light-transmissive drum 50. As a consequence, a deviation would occur between the mask member 22 to be in contact with the peripheral surface of the light-transmissive drum 50 and the photosensitive recording medium 24 outside the mask member 22, thus creating scratches on the surface of the photosensitive recording medium 24 and hence impairing the quality of the picture image.

SUMMARY OF THE INVENTION

It is therefore an object of the present invention to provide an image recording apparatus in which a good quality picture image can be formed on a surface of a photosensitive recording medium without causing any scratch on the surface of the photosensitive recording medium.

Another object of the invention is to provide an image recording apparatus in which the light-transmissive factor or transparency of a conveyor belt for carrying a light-transmissive original or a mask member can be kept constant for a long period of time.

A further object of the invention is to provide an image recording apparatus in which a conveyor belt for carrying a light-transmissive original or a mask member can be electrified to a specified value.

According to the present invention, there is provided an image recording apparatus for forming an image on a photosensitive recording medium by exposing the photosensitive recording medium to light through a light-transmissive original or a mask member, the apparatus comprising: a light source for emitting light; a conveyor belt disposed between the light source and the photosensitive recording medium and having an outer surface for carrying thereon the light-transmissive original or a mask member with a space between the latter and the photosensitive recording medium, the conveyor belt being light-transmissive and dielectric; and means for electrifying the conveyor belt to cause the latter to electro-statically attract the light-transmissive original or a mask member thereto.

Many other advantages, features and additional objects of the present invention will become manifest to those skilled in the art upon making reference to the detailed description and the accompanying drawings in which two embodiments incorporating &he principles of the present invention are shown by way of illustrative example.

BRIEF DESCRIPTION OF THE DRAWINGS

FIG. 2 is a view similar to FIG. 1, showing a modified apparatus; and

FIG. 3 is a schematic vertical cross-sectional view of a conventional apparatus.

DETAILED DESCRIPTION OF THE INVENTION

Figure 1:
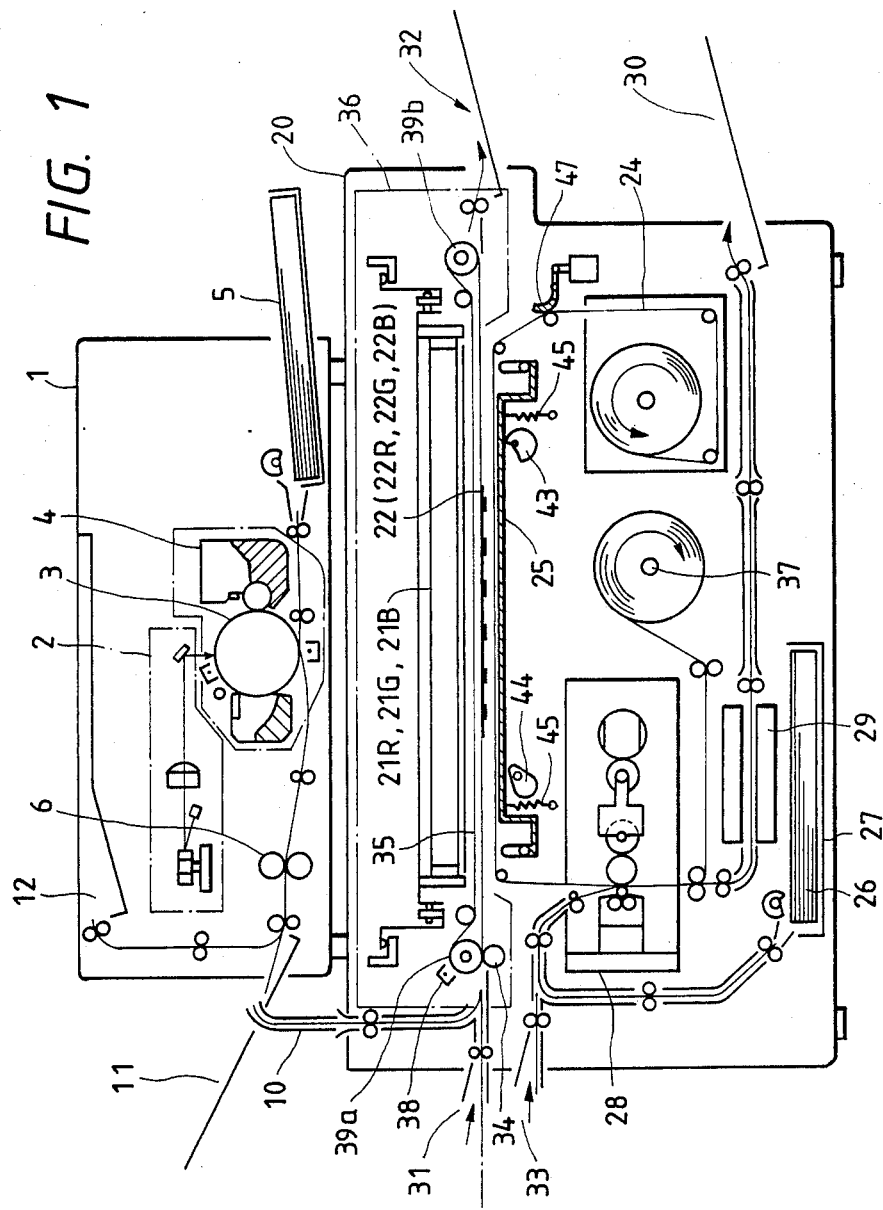
FIG. 1 is a schematic vertical cross-sectional view of an image recording apparatus embodying the present invention, the apparatus being coupled with a monochroprinter.

The principles of the present invention are particularly useful when embodied in a color image recording apparatus (hereinafter called "apparatus") such as shown in FIG. I, generally designated by the numeral 20.

The apparatus 20 is operatively joined with a monochroprinter. In the illustrative embodiment, the monochroprinter is a laserprinter i in which a polygon scanner 2 applies laser light over a charged photosensitive drum 3 to form an optical latent image thereon. Then, toner is supplied from the developing device 4 and applied to the photosensitive drum 3 to develop the latent image into a visible image. The toner image on the photosensitive drum 3 is thereafter transferred onto plain paper, or an OHP sheet, supplied from an intermediate sheet cassette 5. The toner image on the intermediate sheet is fixed by the image fixing device 6 to produce a mask member 22. Usually, the laserprinter records data transmitted from a non-illustrated host computer, and successively produces three kinds of mask members 22(corresponding to cyan, magenta and yellow) based on image information from a host computer. Mask members 22 produced are fed to a discharge tray 11 or another discharge tray 12. In the meantime the apparatus 20 records a picture image by using three mask members 22 produced according to original color picture image information.

The apparatus 20 generally comprises a path change-over unit 10 for changing one paper path to another in order to feed three mask members 22R, 22G, 22B (hereinafter also called "intermediate sheets 22"}from the laserprinter 1 to, an exposure device 36, a conveyor belt 35 for carrying and conveying the individual intermediate sheet 22, an exposure stand 25 on which the intermediate sheet 22 is to be brought in contact with a photosensitive paper 24, three primary color light sources 21R, 21G, 21B for exposure purpose, a sheet cassette 27 for storing a stack of developer sheets 26, and a pressure developing device 28 for bringing the individual developer sheet 26 and the photosensitive paper 24 in contact with each other under pressure to form a visible image on &he developer sheet 26 according to a latent image on the photosensitive recording medium 24.

Each of the developer sheets 26 is coated with a developer material, while the photosensitive recording medium 24 is coated on one surface with a layer comprising microcapsules encapsulating dye precursors as a main component. When the microcapsules on the photosensitive recording medium 24 are ruptured as the photosensitive recording medium 24 together with the developer sheet 26 is pressed by the pressure developing device 28, the developer material on the developer sheet 26 reacts to the dye precursors on the photosensitive recording medium 24 to take on color.

The apparatus 20 also includes a heat-fixing device 29 which serves to assist in coloring of the developer sheet 26 and to make the image surface of the developer sheet 26 glassy, a discharge tray 30 for receiving the developer sheet 26 on which a visible color image is formed, an insertion tray 31 from which the intermediate sheet 22 is to be introduced into the apparatus 20 by hand, another discharge tray 32 for receiving the intermediate sheet 22 after the exposing, and another insertion tray 33 from which the developer sheet 26 is to be introduced into the apparatus 20 by hand.

The conveyor belt 35 is made from transparent dielectric material. For example, used is a film of polyethylene terephthalate having a thickness of 100 μm and a light-transmission factor of over 90 %. A corotron 38 is disposed in closely spaced relation to the outer surface of the conveyor belt 35 for electrifying the latter 35 so that the mask member 22 or a light-transmissive original is electrostatically attracted or stuck to the outer surface of the conveyor belt 35 while the mask member 22 or the light-transmissive original is being conveyed.

The conveyor belt 35 is supported between a pair of rollers 39a, 39b, at least one of which is made of an electrically conductive material such as metal to assist in transferring electric charges from corotron 38 to the conveyor belt 35 and which is electrically grounded (for example roller 39a in FIG. I). one of the rollers 39b is small in diameter to facilitate removing the mask member 22 from the conveyor belt 35.

A location adjusting roller 34 is disposed in confronting relation to the upstream side roller 39a to correct a skew of the mask member 22 before the latter is fed into the exposing station.

In the exposing station, the exposure stand 25 is normally urged downwardly by a pair of extension springs 45, 45. Two cams 43, 44 are disposed under the exposure stand 25 and are angularly movable for moving the exposure stand 25 upwardly against and downwardly under the bias of the springs 45, 45. During this upward and downward movement of the exposure stand 25, the photosensitive recording medium 24 is prevented from being moved by means of retaining action of a retaining pad 47.

A process for forming a color picture image in the image recording apparatus thus constructed will be described below.

One mask member 22R among three mask members 22R, 22G, 22B produced by the laserprinter 1 is fed to the exposure device 36 via the path change-over device I0, and a leading edge of the mask member 22R is located in position by the location adjusting roller 34 at the upstream side of the conveyor belt 35. A skew or slant, if any, of the mask member 22R is corrected by the location adjusting roller 34.

Operation of correcting of a mask member 22 is as follows. The location adjusting roller 34 remains stationary when a mask member 22 is fed thereto. The leading edge of mask member 22 is brought in contact with the location adjusting roller 34, thereby being corrected with the location adjusting roller 34. Then the location adjusting roller 34 begins to rotate in order to feed the mask member 22 to conveyor belt 35.

The conveyor belt 35 is charged with a surface potential of 1,500 V by the corotron 38 to attract or stick the mask member 22R to the outer surface of the conveyor belt 35 under the assistance of the location adjusting roller 34. The mask member 22R is then conveyed until it arrives at a predetermined position in the exposing station. During that time, the mask member 22R is kept stuck to the outer surface of the conveyor belt 35 with e space between the mask member 22R and the photosensitive recording medium 24.

Then, in the exposing station, the two cams 43, 44 are angularly moved by a non-illustrated drive means to lift the exposure stand 25 &o thereby bring the photosensitive recording medium 24 in tight contact with the mask member 22R, whereupon the photosensitive recording medium 24 is exposed to red light from the light source 21R through both the conveyor belt 35 and the mask member 22R. A color latent image corresponding to the mask member 22R is thereby formed on the surface of the photo-sensitive recording medium 24.

After this exposing, the two cams 43, 44 are angularly moved to allow the exposure stand 25 to return its original position under the biasing force of the springs 45, 45 so that the photosensitive recording medium 24 and the mask member 22R are separated from each other. The mask member 22R is then discharged onto the discharge tray 32 as the conveyor belt 35 is moved again.

Subsequently, in same manner, a color latent image corresponding to each of the other mask members 22G, 22B is formed on the same surface of the photosensitive recording medium 24. During that time, since the photo-sensitive recording medium 24 is prevented from being moved by means of retaining action of a retaining pad 47, there is no danger that any shift or shear could occur between the color images corresponding the individual mask members 22R, 22G, 22B.

When the last mask member 22B has been discharged out of the apparatus 20 after exposing of all the three mask members 22R, 22G, 22B, the retaining pad 47 releases the photosensitive recording medium 24.

Finally, for developing, the exposed photosensitive medium 24 is brought in contact with the developer sheet 26 under pressure by the pressure developing device 28. After this developing, the developer sheet 26 is discharged onto the discharge tray 30 via the heat fixing device 29, on the other hand, the used photosensitive recording medium 24 is rolled up round the take-up reel 37.

With the arrangement mentioned above, since the mask member or the light-transmissive original is electrostatically stuck to the conveyor belt without contacting the surface of the photosensitive recording medium during the feeding of the mask member or the light-transmissive original, it is possible to prevent the surface of the photosensitive recording medium from any scratch or other damage. Consequently a recorded sheet with a good quality picture image can be guaranteed. Also the mask member can be prevented from being jammed in the exposing station.

FIG. 2 illustrates a modified apparatus 20A which is similar to the apparatus of FIG. I in construction except the following. This modified apparatus 20A has, in place of the corotron 38 (FIG. i), an electrifying brush 38A of electrically conductive materials such as fibers frictionally contacting the outer surface of the conveyor belt 35 and connected to a non-illustrated high-voltage power source, and also a de-electrifying brush 39A of electrically conductive materials such as fibers frictionally contacting the inner surface of the conveyor belt 35 and electrically grounded.

While the mask member 22 or the light-transmissive original is being conveyed to the exposing station by the conveyor belt 35, the electrifying brush 38A creates electrostatic force on the conveyor belt 35 so that such plate or original is electrostatically attracted or stuck to the outer surface of the conveyor belt 35.

On the other hand the de-electrifying brush 39A eliminates electric charge created due to frictional contact with a pair of the conveyor-belt supporting rollers 39'a, 39'b, thus preventing any dust from being electrostatically attracted or stuck &o the conveyor belt 35.

Further, any dust stuck to the outer and inner surfaces of the conveyor belt 35 is physically wiped off by the respective brushes 38A, 39A as the conveyor belt 35 is moved.

Preferably each of the conveyor-belt supporting rollers 39'a, 39'b, which contacts the electrifying brush 38A through the medium of the conveyor belt 35, has a peripheral surface made of an electrically conductive rubber or plated with chromium, the peripheral surface thereof being electrically grounded. Such peripheral surface of each roller 3g'a, 39'b serves to facilitate electrifying of the conveyor belt 35.

In the embodiment of FIG. 2, as mentioned above, the inner surface of &he conveyor belt 35 is de-electrified or cleaned by using the de-electrifying brush 39A. Alternatively, the inner surface of the conveyor belt 35 may be treated so as to be proof against electric charge. Otherwise the inner surface of the conveyor belt 35 may be treated so as to be electrically conductive, with the peripheral surface of each of the conveyor-belt supporting rollers 39'a, 39'b being electrically grounded. In another alternative form, a cover or guard may be provided to prevent any dust from entering the inside of the conveyor belt 35.

yet, if the conveyor belt 35 is coated with hard resin such a acrylic resin, an improved degree of scratch and wear resistance can be achieved.

With the arrangement of FIG. 2, partly because the conveyor belt is electrified to a specified value by at least one electrically conductive brush contacting at least one surface of the conveyor belt, and partly because any dust stuck to the conveyor belt is wiped off by the brush, it is possible to maintain the light-transmissive factor or transparency of the conveyor belt higher for a long period of time and hence to prevent the photosensitive recording medium from insufficient exposure, thus guaranteeing a good quality of picture image and also decreasing the cost of production.

Many other modifications and variations of the present invention are possible in the light of the foregoing teachings. It is therefore to be understood that within the scope of the appended claims, the invention may be practiced otherwise than as specifically described.

For example, the monochroprinter is not limited to the laser printer and may be any other type such as an LED printer, a liquid crystal printer or a heat-transfer printer, provided that it can produce trichromatic (red, green, blue) resolution originals. Further, a desktop printer may be mounted on the top of the apparatus and is operatively coupled therewith. If a separate large-sized printer is used, trichromatic resolution originals produced by the printer may be supplied into the apparatus via the insertion tray 31.

In the illustrated embodiments, the transfer type recording medium is used, and color forming takes place in combination of the photosensitive recording medium 24 and the developer sheet 26. Alternatively the self-contained type recording medium, which serves as the functions of both the photosensitive recording medium and the developer sheet, may be used.

Further, the conveyor belt 35 is not limited to an endless belt and may be any other form, e.g. an elongated strip having a pair of opposite ends respectively rolled round a pair of rollers.

What is claimed is:

1. An image recording apparatus comprising:
a light source for emitting light;
means for positioning a photosensitive recording medium for exposure to light from the light source;

means for providing mask sheets for the formation of mask images;

mask image forming means for forming sequential mask images on the mask sheets;

light transmissive and dielectric conveying means disposed between the light source and the photosensitive recording medium and having an outer mask sheet receiving surface for positioning the mask sheets having mask images thereon between light from the light source and the photosensitive recording means;

means for electrifying said conveying means to cause the conveying means to attach the mask sheets thereto;

means for exposing the photosensitive recording medium through mask images on a plurality mask of sheets conveyed by the conveying means for forming a completed image thereon;

means for conveying mask sheets from the mask image forming means to the conveying means; and means for removing the mask sheets from the conveying means for discharge from the apparatus.--

2. Apparatus as in claim 1 and further comprising fixing means for fixing on the mask sheets the mask images formed by the mask image forming means.

3. An image recording apparatus according to claim 1, in which said electrifying means includes a corotron disposed in closely spaced relation to said outer surface of said conveying means.

4. An image recording apparatus according to claim 3, in which said electrifying means further includes a pair of rollers for supporting therebetween said conveying means, at least one of said rollers being made of an electrically conductive material and electrically grounded, said corotron being disposed adjacent to one of said rollers.

5. An image recording apparatus according to claim 1, in which said electrifying means includes a brush of electrically conductive materials frictionally contacting said outer surface of said conveying means.

6. An image recording apparatus according to claim 5, further including means for de-electrifying said conveying means.

7. An image recording apparatus according to claim 6, in which said conveying means also has an inner surface, said de-electrifying means including a brush of electrically conductive materials contacting said inner surface of said means and being electrically grounded.

8. An image recording apparatus according to claim 1, in which said conveying means comprises conveyor belt.

9. Apparatus as in claim 1 and further comprising means for moving the photosensitive recording medium toward a mask member on the conveying means before exposure of the photosensitive recording recording means by the light source.--

10. Apparatus as in claim 7, wherein the brush extends across the entire width of the conveying means.--

* * * * *